United States Patent [19]

Schunemann et al.

[11] Patent Number: 5,611,856
[45] Date of Patent: Mar. 18, 1997

[54] METHOD FOR GROWING CRYSTALS

[75] Inventors: Peter G. Schunemann, Malden, Mass.; Thomas M. Pollak, Amherst, N.H.

[73] Assignee: Lockheed Sanders, Inc., Nashua, N.H.

[21] Appl. No.: 245,774

[22] Filed: May 19, 1994

[51] Int. Cl.$^6$ .................................................. C30B 13/02
[52] U.S. Cl. ................. 117/37; 117/43; 117/81; 117/83; 117/937
[58] Field of Search ................. 117/37, 43, 46, 117/81, 82, 83, 100, 203, 204, 937, 938, 956, 958

[56] References Cited

U.S. PATENT DOCUMENTS 3,933,900  1/1976  Gentile et al. ................. 117/937
4,853,066  8/1989  Yoshida et al. ................. 117/82

OTHER PUBLICATIONS

"Second & Fourth ordea non linear processes in chalcopyrites";Kildall et al.; Optical Phenom. Infrared Mater., Dis. Tech. Pap. Top. Meet (1977).

Primary Examiner—Robert Kunemund
Assistant Examiner—Felisa Garrett
Attorney, Agent, or Firm—David W. Gomes

[57] ABSTRACT

The present invention provides a method for producing single crystals of a group II-IV-$V_2$ and group I-III-$VI_2$ compounds by synthesizing compound material from its constituents and separately melting and refreezing the material in a transparent furnace while observing crystal growth.

20 Claims, 2 Drawing Sheets

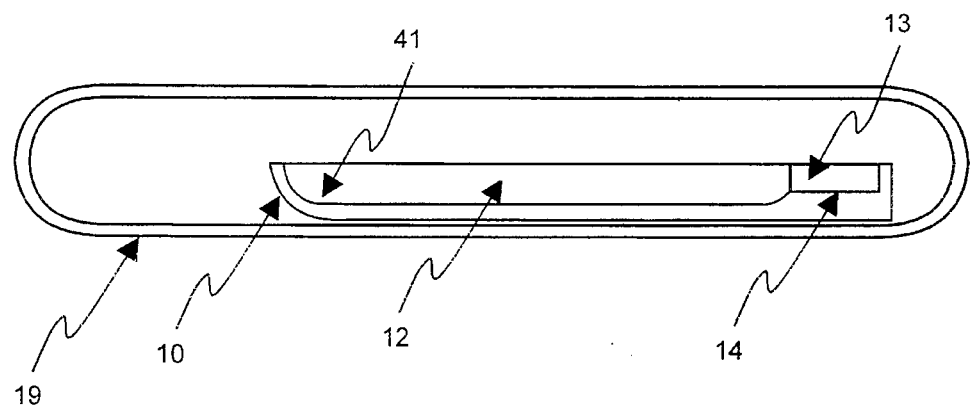
FIG. 1
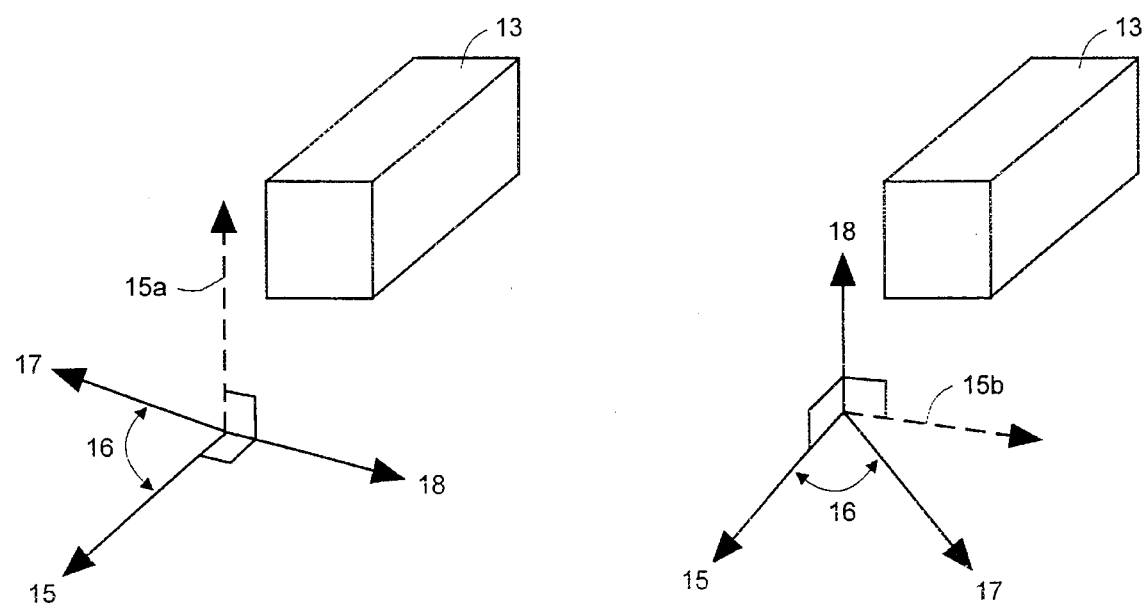
FIG. 2A
FIG. 2B

METHOD FOR GROWING CRYSTALS

Government Rights

The United States Government has a nonexclusive, non-transferable, irrevocable, paid-up license to practice or have practiced for or on behalf of the United States the present invention throughout the world.

BACKGROUND OF THE INVENTION

1. Field of the Invention

The present invention generally relates to crystal growth and, in particular, to the growth of single crystals of ternary chalcopyrite compounds of the general formula II-IV-$V_2$, and I-III-$VI_2$. According to this rotation, the Roman numerals I through VI represent elements from columns IB through VIB of the Periodic Table, where I is Cu, Ag, Au or mixtures thereof; II is Zn, Cd, Hg or mixtures thereof; III is Al, Ga, In, Tl or mixtures thereof; IV is Si, Ge, Sn or mixtures thereof; V is P, As, Sb or mixtures thereof; and VI is S, Se, Te, or mixtures thereof.

2. Statement of the Prior Art

Single crystals of elemental group II-IV-$V_2$ compounds such as zinc germanium phosphide, as well as single crystals of elemental group I-III-$VI_2$ compounds, such as silver gallium selenide, can be used for shifting the wavelength of various laser sources into the mid-infrared region of the spectrum (approximately 2 to 8 microns). One of two non-linear optical processes for wavelength shifting is Second Harmonic Generation (SHG), which is used to double the frequency (halve the wavelength) of far-infrared carbon dioxide lasers. The other optical process is Optical Parametric Oscillation (OPO) which can be used to double the wavelength of various near-infrared solid-state lasers. In either case, the efficiency at which the wavelength of the laser radiation can be shifted into the mid-infrared can generally be improved by increasing the length of the crystal as well as by improving the transparency and overall optical quality thereof. In addition, the frequency conversion process is possible only along certain crystallographic directions known as the "phase matching" directions in the material. Since the highest possible conversion efficiency is required for the laser applications in which these crystals are employed, it is desirable to produce high optical quality crystals with low absorption losses in the direction required for phase-matching.

The most common problems that occur during attempts at growing large crystals are cracking and the growth of multiple crystals. In addition, deficiencies in the final composition of the crystals often occur which lead to decreased transparency due to absorption and/or scattering losses. One final difficulty relating to the growth of phosphorus-containing compounds such as $ZnGeP_2$ is the danger of explosion when attempting to synthesize the compound from the individual elements.

B. Ray et al, Phys. Star. Sol. 35,197 (1969), describes two methods for synthesizing $ZnGeP_2$, one involving direct reaction of the starting elements and one two-step approach in which Ge is combined with pre-reacted $ZnP_2$. The heating cycle for the direct synthesis process features 48 hour and 16 hour soaks at 530° C. and 900° C. respectively to avoid explosion of the silica ampoule. Their subsequent crystal growth attempts, however, yielded only cracked, polycrystalline ingots with poor transparency.

One slightly more successful approach was published in 1973 (J. Elect. Mat. 2,445) by Buehler and Wernick. Stoichiometric amounts of zinc germanium and phosphorus, as well as excess phosphorous or zinc diphosphide, for the vapor phase, were loaded into a vitreous carbon boat and sealed into an evacuated quartz ampoule. The ampoule was heated stepwise in a resistance wound, single zone furnace at an average rate of 125° C./day to above the melting temperature. The furnace was then cooled at rates approaching 25° C./day through the freezing point and subsequent solid state phase transition and thereafter at a rate of 50°–75° C./day to room temperature. Temperature gradients during cooling varied from 0.24° C./cm. to 2.0° C./cm. For temperature gradients of less than 0.4° C./cm, the process resulted in crack-free, single crystals weighing between 7 and 10 grams. Higher temperature gradients resulted in large grain polycrystalline ingots with numerous cracks and bubbles. In either case, the crystals were randomly oriented and too small to yield samples for device applications. Unfortunately, these and other previous attempts have failed to provide larger, oriented single, crack-free crystals of this compound.

R. S. Feigelson and R. K. Route, Opt. Eng. 26, 113, 1987, describe the growth of large crack and twin-free single crystals of two other chalcopyrite compounds, $AgGaS_2$ and $AgGaSe_2$, with diameters from 28 mm to 37 mm and lengths up to 100 mm by the standard Bridgman-Stockbarger method. The essential features of their process were 1) the use of tapered vertical ampoules, and 2) the use of seed crystals oriented along the [001] c-axis. These features were necessary to successfully grow crack-free crystals using a vertical geometry, because both of these materials expand along their c-axis during cooling. Consequently, these materials cannot be grown by this technique along the orientations required for most laser applications, since these orientations are far from the c-axis.

Chalcopyrite crystals typically require a post-growth heat treatment in order to improve their transparency for laser applications. In the case of the I-III-$VI_2$ materials $AgGaSe_2$ and $AgGaS_2$, the poor as-grown transparency is due to light scattering by second-phase $Ga_2Se_3$ and $Ga_2S_3$ precipitates respectively. Feigelson and Route teach a method for annealing these crystals in sealed quartz ampoules in the presence of excess $Ag_2Se$ and $Ag_2S$ respectively which produces near-theoretical transparency by dissolving the precipitates.

II-IV-$V_2$ crystals like $ZnGeP_2$ are generally free of scattering centers, but their transparency is often limited by a defect-related absorption band which extends from the band edge into the infrared portion of the spectrum. Y. V. Rud and R. V. Masagutova (Sov. Tech. Phys. Lett. 7,72, 1981) describe an annealing technique for reducing this absorption in the edge region which involves annealing thin $ZnGeP_2$ samples in sealed quartz ampoules packed with $ZnGeP_2$ powder for approximately 150 hrs. in the temperature range 450° C. to 550° C. Considerable improvement was observed, but no device-quality crystals were produced.

SUMMARY OF THE INVENTION

Accordingly, it is an object of the present invention to provide a method for growing large, single, crack-free crystals of ternary chalcopyrite compounds.

It is a further object to grow such crystals with sufficient optical quality for infrared laser applications.

It is a still further object to grow such crystals along or near the crystallographic "phase matching" directions required for various laser applications.

It is a still further object to grow such crystals of the general formula II-IV-V$_2$, such as zinc germanium phosphide.

It is a still further object to grow such crystals of the general formula I-III-VI$_2$, such as silver gallium selenide.

These and other objects of the invention will be apparent from the description that follows.

Accordingly, the present invention provides a method for producing single crystals of a group II-IV-V$_2$ and group I-III-VI$_2$ compounds from their constituents, comprising the steps of: synthesizing a compound material for the crystal to be produced including the steps of heating the constituents thereof to above the melting temperature of the compound material, maintaining the melted constituents above said melting temperature for a predetermined period of time and then cooling the melted constituents to freeze the resulting compound material, melting the frozen compound material adjacent to a seed crystal, using a transparent horizontal gradient freeze furnace which maintains a substantially uniform temperature gradient of less than 3° C. per centimeter in the direction of intended crystal growth, until all of the compound material and a part of the seed crystal melts, and freezing the melted compound material at a controlled rate of freezing to grow the single crystal from the seed crystal in accordance with the crystal orientation of the seed crystal including the step of observing the crystal during freezing to detect the formation of multiple grain patterns.

In a refinement of the invention, the transparent furnace includes a plurality of cylindrical quartz tubes concentrically located within a cylindrical PYREX tube having a partially transparent layer of gold coated on the inside thereof for reflecting heat back into the furnace. In another refinement, the furnace maintains a longitudinal temperature gradient of approximately 2° C. per centimeter and the freezing is performed by lowering the temperature of the furnace at a rate of approximately 0.2° C. per hour to produce a freezing rate of approximately 1 millimeter per hour.

In yet another refinement, the seed crystal is oriented with respect to a crystallographic direction of the compound to produce freezing of the compound material in an application specific direction of the crystal and the crystal has an anisotropic axis which is located in a direction which allows the greatest flexibility in the useful nonlinear optic phase match angle of the resulting crystal.

BRIEF DESCRIPTION OF THE DRAWINGS

The present invention is illustratively shown and described in reference to the appended drawings as follows:

FIG. 1 is a sectional side view showing the configuration of a boat and ampoule used for crystal growth;

FIGS. 2a and 2b are side views of two preferred orientations for the seed crystal.

DETAILED DESCRIPTION OF THE INVENTION

Figure 3:
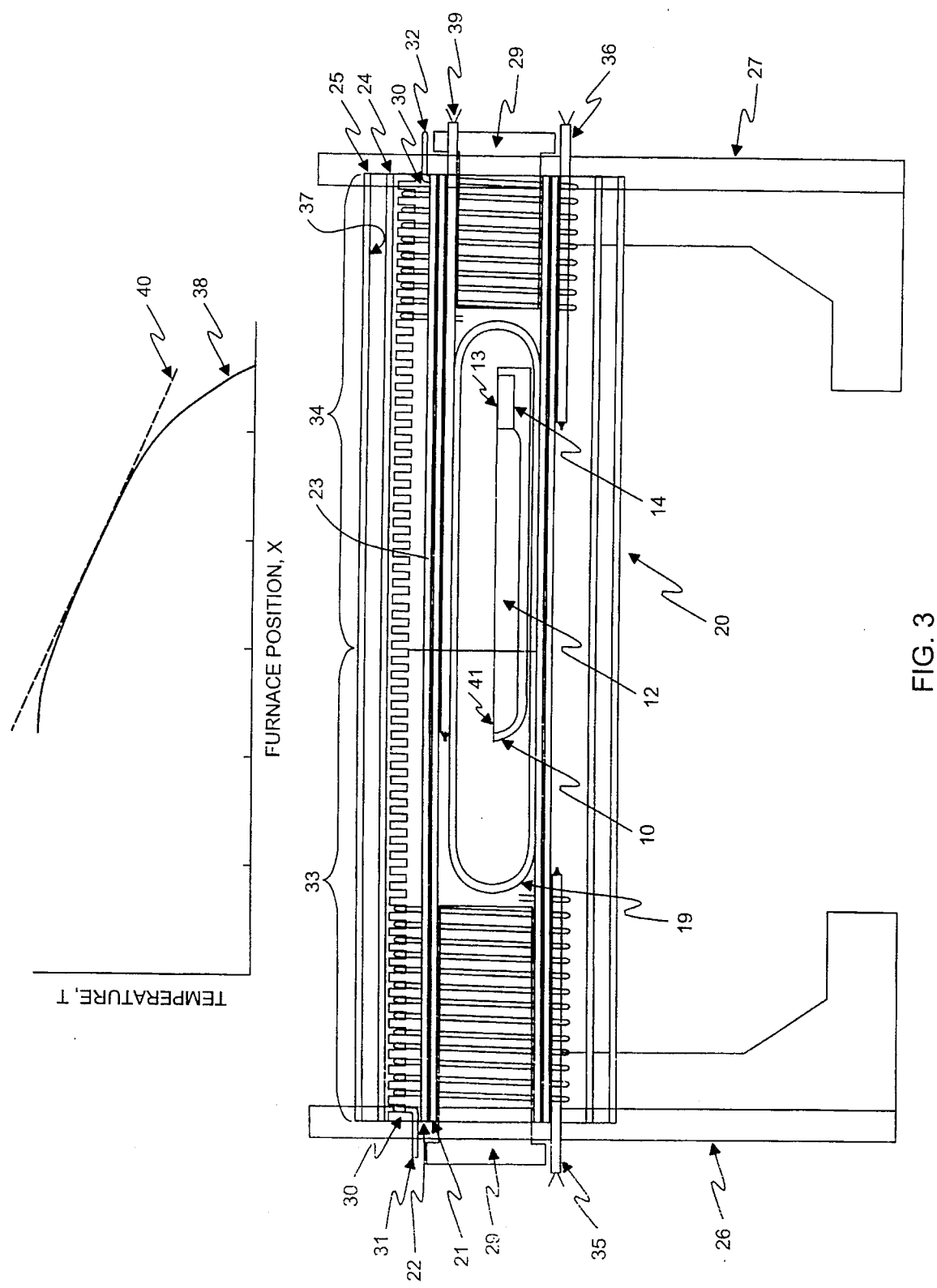
FIG. 3 is a sectional side view of a transparent furnace used for crystal growth in accordance with one embodiment of the present invention.

The overall process generally includes two steps, namely synthesizing the compound material and forming the crystal. These steps may be followed by the step of annealing the crystal.

The compound material is synthesized in an ordinary single-zone shunt-type tube furnace. A mixture of predetermined amounts of the constituents, zinc (Zn) from group II, germanium (Ge) from Group IV, and phosphorus (P) from group V, are placed alternatively in a boat and ampoule, or just a coated ampoule, which ampoule is then evacuated to a pressure of less than $10^{-6}$ torr and sealed. The ampoule is made of quartz and has an inner diameter of 25 mm and a wall thickness of 3.5 mm, which corresponds to a wall-to-bore cross-section ratio of 0.64 needed to withstand process pressures of 60 atm or more. The sealed ampoule is placed in the shunt-type tube furnace which is designed to have a somewhat flat temperature gradient. A temperature difference of 30° C. between the middle and ends of the ampoule is acceptable and some temperature gradient is preferred.

The constituent mixture is heated relatively rapidly at a rate of approximately 50° C./hr up to a temperature of approximately 530° C. which causes the internal ampoule pressure to rise to approximately 30 atm. Above 530° C., the rate of temperature increase is lowered to approximately 4° C./hr, because in this range the pressure increase from the gaseous formation of Zn and P is substantial and can cause the ampoule to explode. The small temperature gradient in the ampoule causes some condensation of Zn and P at the ends of the ampoule which helps to restrain the rate of pressure increase. The amount of Zn and P which condenses on the ends of the ampoule is fairly reproducible, so an extra amount of these constituents can be added to the initial mixture to compensate for the condensation losses and thereby partially control the chemical composition of the end product. This control improves the optical qualities of the final crystal. As the entire ampoule approaches 630° C., a reaction occurs resulting in the formation of ZnP$_2$. This compound has a very low vapor pressure (<1atm) at this temperature, so that heating can continue without danger of explosion.

Once the ZnP$_2$ is formed, the ampoule can be heated more rapidly at about 20° C./hr until the temperature sufficiently exceeds the melting point of ZnGeP$_2$ (~1027) to ensure complete melting, typically 1050° C. The mixture is held at 1050° C. for a predetermined period of time (nominally 8 hrs) to promote mixing of the compound constituents, and then it is allowed to cool relatively rapidly at a rate equal to or greater than 60° C./hr to produce a polycrystalline ingot.

After synthesis, the ampoule is opened and the polycrystalline ingot is removed, weighed, and re-encapsulated in the configuration required for single crystal growth shown in FIG. 1. One or more polycrystalline ingots are loaded into the crystal growth boat 10 to provide enough material to fill the main boat volume 12 when melted. Depending on how much ZnP$_2$ was lost to vapor deposits during synthesis, additional Ge or ZnP$_2$ powder is added to correct the composition.

The boat 10 can be made of quartz, carbon-coated quartz, graphite, carbon-coated graphite, vitreous carbon, pyrolytic boron nitride (PBN), or PBN-coated graphite, but in the preferred embodiment PBN-coated graphite is used. Boat 10 has a cylindrical shape in its central section where the graphite is approximately 3 mm thick. PBN is deposited on the graphite with a thickness of approximately 25 to 50 microns.

A single crystal seed 13 of FIGS. 2a and 2b, which should be free of cracks, twins, and secondary grains, is placed in the seed well 14 of boat 10. The seed crystal can be of random orientation or can be oriented along a high symmetry direction of the crystal such as [100], [001], [110], [112], etc. In the preferred embodiment, the seed crystal is oriented along the phase-matching direction 15 required for a specific laser application as shown in FIGS. 2a and 2b. The phase-matching direction 15 occurs at an angle 16 with respect to the optic axis (or c-axis) 17 of the crystal. In FIG. 2a, optic axis 17 lies in a vertical plane between phase-matching direction 15 and the vertical axis 15a. In FIG. 2b, optic axis 17 lies in a horizontal plane between phase-matching direction 15 and horizontal axis 15b.

The angle 16 depends upon the refractive indices of the crystal at the input and output wavelengths of a given laser application and can be calculated using standard equations. (See, for example, A. Yariv, *Quantum Electronics*, 3rd Edition, Wiley, New York 1989.) For example, the phase matching angle 16 is equal to 55° for $ZnGeP_2$ crystals used to double the wavelength of 2.05-micron holmium lasers and is equal to 47 degrees for $AgGaSe_2$ crystals used to double the frequency of 9.3 micron carbon dioxide lasers.

The rotation axis 18, which is chosen to give the maximum nonlinear optical coefficient for a given laser application, is perpendicular to both the phase-matching direction 15 and the optic axis 17.

For so-called type I phase-matching in chalcopyrite crystals, this axis 18 corresponds to [100] for positive uniaxial materials (like $ZnGeP_2$) and to [110] for negative uniaxial materials (like $AgGaSe_2$). The seed crystal should be fabricated so that the rotation axis 18 lies either in the horizontal or the vertical plane of the boat 10, as shown in 2a and 2b respectively. This allows for the largest possible application-specific samples to be cut from the boule, minimizes waste, and simplifies the post-process machining.

Since the geometry shown in FIG. 1 produces a horizontal "D"-shaped boule, the rotation axis 18 should be vertical (FIG. 2b) to achieve the greatest flexibility in the phase-matching angle 16 without substantially compromising the length of the samples produced. However for crystals which expand along the c-axis during cooling (such as $AgGaSe_2$), the rotation axis 18 should be horizontal (FIG. 2a) to allow the c-axis to expand freely toward the unconstrained top surface of the boule.

The boat 10 containing the presynthesized compound and the oriented seed crystal 13 are placed in an ampoule 19 which is evacuated, sealed and loaded into a dual zone, horizontal temperature gradient or gradient freeze furnace 20 as shown in FIG. 3.

Furnace 20 generally consists of four concentric cylinders, including an inner cylinder 21 known as the muffle tube, a two-piece heater support tube 22, 23 a shield tube 24, and an outer tube 25 known as the mirror tube, which cylinders 21–25 are closed and supported by ceramic end caps 26, 27.

The muffle tube 21 is made of quartz and supports the ampoule 19 near the concentric radial center of all cylinders 21–25. With ampoule 19 located within cylinder 21, the ends thereof are closed with insulation 29.

The heater support tubes 22, 23 are located flush around the outside surface of the muffle tube 21 and are also made of quartz. Attached to the outside surface of each heater support tube 22, 23 are three equi-spaced slotted quartz rods 30. The slotted rods 30 are offset so as to allow the heating coils 31, 32 to be helically wound onto the heater support tubes 22 and 23 respectively. The slotted quartz rods 30 serve to separate and maintain the spacing of the heating coils. The heating coil spacing is selected to yield a desired range of longitudinal temperature gradients.

Heating coils 31, 32, which are made of Kanthal A-1 or APM wire, create separate heating zones 33, 34 in their respective halves. The temperature of each heating zone 33, 34 is measured by a control thermocouple 35, 36 which provides feedback to a microprocessor temperature controller (not shown) which adjusts the output power to each heating coil 31, 32. A separate microprocessor can be used for each zone, or a single microprocessor can control both zones with a fixed temperature bias between the two zones.

The shield tube 24, which is made of quartz, slides over the heater support tubes and slotted rods to keep the heating coats 31,32 inside their slots when the coils expand upon heating.

The outer mirror tube 25 is coated with a thin layer of gold 37. The gold coating 37 is a very efficient infrared reflector which serves to keep most of the heat inside the furnace, but if thin enough, the gold is partially transparent to let light in and out of the furnace for viewing. The mirror tube 25 can be made of either quartz or PYREX, and the gold coating 37 can be on either the internal or external surface of the tube. In the preferred embodiment, the mirror tube 25 is made of PYREX (since the gold coating 37 adheres to PYREX more effectively than to quartz), in which case the gold coating 37 must be internal to keep the PYREX from softening. PYREX softens around 500° C. but furnace heat is sufficiently reflected by the gold coating 37 to allow furnace operation well in excess of 1000° C. The inner diameter of the mirror tube 25 must be sufficiently larger than the outer diameter of the shield tube 24 to provide a sizable air gap to keep the gold coating 37 from evaporating. The choice of mirror tube diameter and coating thickness also serve to govern the radial gradients in the system. Low gradients are the most desirable, and are obtained by minimizing the mirror tube diameter and maximizing the coating thickness while maintaining adequate coating transparency and lifetime.

Once the ampoule 19 is loaded into the furnace 20, the furnace 20 is heated relatively rapidly at a rate of approximately 350° C./hr to a temperature sufficient to begin melting the material in the boat. The left heating zone 33 is maintained at a higher temperature than the right heating zone 34 so that the compound material melts from the end 41 thereof which is opposite to the seed crystal 13. The resulting longitudinal temperature profile 38 is measured by translating the process thermocouple 39 back and forth along the length of the furnace occupied by the boat. In one embodiment, the linear fit 40 has a slope which is equal to an average temperature gradient of less than 5° C./cm or between 1° C. and 3° C. per centimeter, preferably 2° C./cm, over the majority of the main boat volume 12. At the end 41 of the boat, away from the seed 13, it is desirable for the gradient to become more shallow and increase the growth rate to compensate for a decreasing melting point as the composition changes at the end of the growing crystal. At the seed end of the boat, it is desirable for the gradient to become more steep to give a slow growth rate during seeding which gradually increases and becomes constant as the crystal grows into the main boat volume 12. The temperature profile is adjusted by changing the relative temperatures of the control thermocouples 35 and 36.

When the desired temperature profile 38 is established, the temperatures of both zones 33, 34 are gradually increased in discrete 1° C. to 2° C. steps over a period of several hours until the tip of the seed crystal 13 is melted. After soaking in this temperature range for approximately 1 to 5 hours, the temperature is very slowly cooled at a rate which will produce an average growth rate of approximately 1 mm/hr, which for the typical 2° C./cm gradient corresponds to 0.2° C./hr. This rate of cooling is maintained until the entire crystal is formed. Thereafter the temperature is reduced at a rate between 5° C. and 25° C./hr to room temperature unless the material undergoes a solid state phase transition (like $ZnGeP_2$, at 952° C.), in which case cooling proceeds slowly (between 1° C. and 5° C./hr) until the hottest end 41 of the crystal (opposite the seed) is below the phase transition temperature (940° C. for $ZnGeP_2$).

The temperature gradient within the furnace and ampoule is important for several reasons. Larger temperature gradients increase the likelihood of the crystal cracking during cooling, adversely affect the optical homogeneity, and result in excessive loss of Zn and P due to evaporation and condensation on the coldest spot of the ampoule. Smaller temperature gradients, however, like those used by Beuhler, adversely affect the shape of the crystal/liquid interface, causing it to become more concave such that any secondary grains which nucleate on the boat surface grow in towards the center of the boule. The temperature gradient in use enables a slow growth rate of 1 mm/hr or less because lower temperature gradients require unreasonably slow cooling rates which are difficult to generate with available process controllers and furnaces.

Prior to and during crystallization, the compound material is observed through the transparent furnace to monitor melting of the seed crystal and also the freezing process. In the event of formation of multiple grain patterns in the crystal, the observable roughness in the crystal surface will increase. At this point, the growth process may be partially reversed and the affected part of the crystal remelted and regrown. The phrase "multiple grain patterns" and the like used throughout this specification and claims is intended to cover all varieties of undesirable crystal growth including, but not limited to, such formations as twinning as well as fully independent multiple crystals. During crystallization, the crystal/liquid interface may also be detectable by observing the top surface for some compound materials. Liquid material appears somewhat shiny and curved, while the formed crystal may appear somewhat duller and flatter. Observation may be aided by tapping the furnace or its support structure to cause movement of the liquid relative to the stationary crystal, but this procedure may adversely affect the crystallization process and is not preferred.

After cooling to room temperature, the grown crystal is removed from the ampoule, X-rayed to make minor adjustments to the orientation, and machined into slabs with the proper orientation for a specific laser application. The individual device samples, or the entire boule, before final machining, are then heat-treated to cure specific growth induced defects which degrade the optical transmission of the crystals.

In the case of $ZnGeP_2$ (and $II-IV-V_2$ crystals in general), the samples are packed in $ZnP_2$ ($II-V_2$) powder, encapsulated in evacuated quartz ampoules, heated to between 550° C. and 565° C., soaked in this temperature range for 150 to 300 hours, and cooled to room temperature. Heating and cooling rates are not critical except that they should be conservative (150° C./hr) if the material has highly anisotropic thermal expansion coefficients (such as $CdGeAs_2$). The sample size is also not critical, since the process which improves the transparency of $II-IV-V_2$ crystals is a uniform atomic ordering process which does not depend on diffusion of constituent species from the surface into the bulk. Some annealing may also be performed during the cooling process after crystal formation. This may be performed by maintaining a cooling rate of less than 5° C./hr until the temperature is approximately 500° C.

CONCLUSION

In terms of $ZnGeP_2$ compound synthesis, we have discovered that, contrary to what is taught in the Ray et al. article, substantial reaction between zinc and phosphorus does not occur until 630° C. (100° C. higher than reported); and the reaction with Ge at approximately 900° C. is sufficiently rapid that no soak time is needed. According to this invention, the synthesis process has been modified to reproducibly synthesize $ZnGeP_2$ without explosion and in much shorter cycle times.

In terms of crystal growth, we have found that large, crack-free crystals of $ZnGeP_2$ exceeding 75 g can be reproducibly grown using a horizontal gradient freeze technique with longitudinal temperature gradients between 1° and 3° C./cm (contrary to Beuhler et al. who required gradients less than 0.4° C./cm). More importantly, these crystals can be produced with the size, orientation, and transparency required for fabricating nonlinear optical devices.

While the method of the invention is particularly useful for growing large, substantially flaw-free crystals of $ZnGeP_2$, it can be applied to any chalcopyrite crystal of the general formula $I-III-VI_2$ or $II-IV-V_2$, and growth is not restricted to the [001] direction as in vertical Bridgman growth of $AgGaSe_2$ and $AgGaS_2$.

Finally, the method of this invention includes an improved annealing technique for $ZnGeP_2$ and other $II-IV-V_2$ compounds which sufficiently reduces the absorption losses to produce device-quality crystals capable of efficient nonlinear frequency conversion of laser radiation into the mid-infrared. $ZnP_2$ powder is used in place of the $ZnGeP_2$ powder of Rud and Masagutova, and slightly higher temperatures (550° C.) and longer annealing times (300 hrs) are used. Contrary to Rud and Masagutova, who reported that the 1.1-micron absorption level could be reduced to 4–5 $cm^{-1}$ regardless of the initial state, we have discovered that the value after annealing is directly related to the as-grown absorption coefficient. In order to obtain the lowest losses required for device applications, the as-grown stoichiometry must be as near as possible to 1:1 Ge to $ZnP_2$, since deviations on both sides of stoichiometry increase the 1.1-micron absorption coefficient, which is then reduced by 40% upon subsequent annealing.

The method of the present invention thereby facilitates the extended growth of crystals while maintaining the optical qualities thereof. The use of the transparent furnace provides quality control of the growth process by allowing the growth processes to be reversed for any portions of the crystal exhibiting multiple grain patterns. The separate step of synthesizing the compound material separates the difficult and potentially explosive formation process thereby enabling better control of the delicate freezing process. The temperature control, the constituent control, and the annealing ingredients improve the constituent mixture of the crystals which reduces optical losses therein.

The embodiments described above are intended to be taken in an illustrative and not a limiting sense. Various modifications and changes may be made to the above embodiments by persons skilled in the art without departing from the scope of the present invention as defined in the appended claims.

What is claimed is:

1. A method for producing single crystals of a group $II-IV-V_2$ and group $[I-III-IV_2]$ $I-III-VI_2$ compounds from their constituents, comprising the steps of:

synthesizing a compound material for the crystal to be produced including steps of heating the constituents thereof to above a melting temperature of the compound material, maintaining the melted constituents above said melting temperature for a period of time and then cooling the melted constituents to freeze the resulting compound material;

melting the frozen compound material adjacent to a seed crystal, using a transparent horizontal gradient freeze furnace which maintains a substantially uniform temperature gradient of less than 5° C. per centimeter in the direction of intended growth, until all of the compound material and a part of the seed crystal melts, said seed crystal having a known crystallographic orientation; and freezing the melted compound material at a controlled rate of freezing to grow the single crystal from the seed crystal in accordance with the known crystallographic orientation of the seed crystal including a step of observing the crystal during freezing to detect the formation of multiple grain patterns.

2. The method of claim 1, wherein the transparent furnace includes a plurality of cylindrical quartz tubes concentrically located within a cylindrical glass tube having a partially transparent layer of gold coated on the inside thereof for reflecting heat back into the furnace.

3. The method of claim 2, wherein the step of freezing includes limiting the temperature gradient of the freezing portion of the crystal in directions normal to crystal growth.

4. The method of claim 3, wherein the furnace maintains a longitudinal temperature gradient of approximately 2° C. per centimeter and further wherein the freezing is performed by lowering the temperature of the furnace at a rate of approximately 0.2° C. per hour to produce a freezing rate of approximately 1 millimeter per hour.

5. The method of claim 4, wherein the seed crystal is oriented with respect to a crystallographic direction of the compound to produce freezing of the compound material in an application specific direction of the crystal.

6. The method of claim 5, wherein the seed crystal has an optic axis which is located in a horizontal plane with the application specific direction and allows the greatest flexibility in a useful nonlinear optic phase match angle of the resulting crystal.

7. The method of claim 5, wherein the crystal has an an axis which expands during cooling and is oriented vertically with respect to the application specific direction of freezing.

8. The method of claim 1, wherein the step of synthesizing includes heating the constituents at a controlled rate over a predetermined temperature range to limit the rate of vaporization of one or more of the constituents.

9. The method of claim 8, wherein the temperature increase is limited to approximately 4° C. per hour between the temperatures of approximately 530° C. and 630° C.

10. The method of claim 9, wherein the step of synthesis is performed in an evacuated sealed container and includes limiting pressure increase rates within the container during heating by providing a temperature gradient across the container to cause condensation of some of the constituents during heating.

11. The method of claim 10, wherein the compound constituents are zinc, germanium and phosphorus and further wherein extra amounts of zinc and phosphorus are included in the materials to be melted in the synthesis step to compensate for the vaporization and condensation of zinc and phosphorus during the heating thereof.

12. The method of claim 1, further comprising a step of annealing the grown crystal by heating it in the presence of extra amounts of one or more of the constituents to maintain constituent content while enhancing crystal structure of the single crystal.

13. The method of claim 12, wherein the step of annealing is performed with extra amounts of only those compound constituents having the highest vapor pressures during formation of the compound material.

14. The method of claim 13, wherein the compound constituents are from groups II, IVB and VB of the periodic table and further wherein the extra amounts of compound constituents are in the form of a compound of the formula $II-V_2$.

15. The method of claim 14, wherein the compound constituents are zinc, germanium and phosphorus and further wherein the extra amounts of compound constituents are in the form of a compound, namely $ZnP_2$.

16. The method of claim 1, wherein the single crystal produced includes $ZnGeP_2$.

17. The method of claim 1, wherein the single crystal produced includes $AgGaSe_2$.

18. The method of claim 1, wherein the single crystal produced includes $ZnGeAs_2$.

19. The method of claim 1, wherein the single crystal produced includes $CdGeAs_2$.

20. The method of claim 1, wherein the step of melting the frozen compound material is performed in a boat made of graphite and coated with pyrolytic boron nitrite.

* * * * *